(12) United States Patent
Akiyama et al.

(10) Patent No.: US 7,927,952 B2
(45) Date of Patent: Apr. 19, 2011

(54) METHOD OF MANUFACTURING SEMICONDUCTOR DEVICES

(75) Inventors: Miwako Akiyama, Hachioji (JP); Yusuke Kawaguchi, Kanagawa (JP); Yoshihiro Yamaguchi, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 12/128,326

(22) Filed: May 28, 2008

(65) Prior Publication Data

US 2008/0299725 A1 Dec. 4, 2008

(30) Foreign Application Priority Data

May 29, 2007 (JP) ................................. 2007-141213

(51) Int. Cl.
*H01L 21/336* (2006.01)
(52) U.S. Cl. ........ 438/270; 438/268; 438/269; 438/271; 438/272; 438/273
(58) Field of Classification Search ........... 438/268–274
See application file for complete search history.

(56) References Cited

U.S. PATENT DOCUMENTS

| | | | | |
|---|---|---|---|---|
| 4,868,135 A | * | 9/1989 | Ogura et al. | 438/203 |
| 5,963,799 A | * | 10/1999 | Wu | 438/199 |
| 6,127,247 A | * | 10/2000 | Wu | 438/514 |
| 6,198,131 B1 | | 3/2001 | Tung | |
| 6,258,670 B1 | | 7/2001 | Tung | |
| 6,465,308 B1 | | 10/2002 | Cheng et al. | |
| 6,563,169 B1 | * | 5/2003 | Miyakoshi et al. | 257/339 |
| 2002/0127793 A1 | * | 9/2002 | Murata et al. | 438/241 |
| 2003/0034531 A1 | * | 2/2003 | Kanda et al. | 257/392 |
| 2005/0202637 A1 | * | 9/2005 | Chiola | 438/270 |
| 2007/0128788 A1 | | 6/2007 | Lee et al. | |

FOREIGN PATENT DOCUMENTS

JP 8-274313 10/1996

\* cited by examiner

*Primary Examiner* — Michael S Lebentritt
*Assistant Examiner* — Karen M Kusumakar
(74) *Attorney, Agent, or Firm* — Oblon, Spivak, McClelland, Maier & Neustadt, L.L.P.

(57) ABSTRACT

A method of manufacturing semiconductor devices comprises forming an semiconductor layer of the first conduction type on a substrate of the first conduction type; forming an anti-oxidizing layer on the surface of the semiconductor layer of the first conduction type, the anti-oxidizing layer having an aperture only through a region for use in formation of a guard ring layer of the second conduction type; forming the guard ring layer of the second conduction type in the surface of the semiconductor layer of the first conduction type through implantation of ions into a surface where said anti-oxidizing layer is formed; forming an oxide layer at least in the aperture; forming a base layer of the second conduction type adjacent to the guard ring layer of the second conduction type in the surface of the semiconductor layer of the first conduction type; and forming a diffused layer of the first conduction type through implantation of ions into the base layer of the second conduction type.

18 Claims, 6 Drawing Sheets

US 7,927,952 B2

METHOD OF MANUFACTURING SEMICONDUCTOR DEVICES

CROSS-REFERENCE TO RELATED APPLICATION

This application is based upon and claims the benefit of priority from prior Japanese Patent Application No. 2007-141213, filed on May 29, 2007, the entire contents of which are incorporated herein by reference.

BACKGROUND OF THE INVENTION

1. Field of the Invention

The present invention relates to a method of manufacturing semiconductor devices, and more particularly to a method of manufacturing MOS-type semiconductor devices.

2. Description of the Related Art

In recent years, computers and communications devices use integrated circuits (ICs) comprising a plurality of transistors and resistors to configure electric circuits in many cases. Among such the ICs, those including a high-breakdown voltage element are referred to as power ICs. Of the power ICs, those including a drive circuit integrated with a control circuit can be employed in many applications such as display drivers and vehicle-mounted ICs.

A MOS-type field effect transistor (MOSFET) used in the output of the power IC of this type is generally fabricated on a substrate of semiconductor such as silicon through processes of photolithography, ion implantation, thermal oxidation and film formation as described in JP 8-274313A. There is a demand for processes that require a short time and a small number of steps as long as possible from the viewpoint of the cost. In particular, photolithography requires a series of steps such as resist application, pre-baking, exposing by the exposure device, development, and drying. Accordingly, the heavy use extremely lowers the throughput and causes an increase in cost.

SUMMARY OF THE INVENTION

In an aspect the present invention provides a method of manufacturing semiconductor devices, comprising: forming an anti-oxidizing layer on a surface of a semiconductor layer of a first conduction type, the anti-oxidizing layer having an aperture only through a region for use in formation of a guard ring layer of a second conduction type; forming the guard ring layer of the second conduction type in the surface of the semiconductor layer of the first conduction type through implantation of ions into a surface where said anti-oxidizing layer is formed; forming an oxide layer at least in the aperture; forming a base layer of the second conduction type adjacent to the guard ring layer of the second conduction type in the surface of the semiconductor layer of the first conduction type; and forming a diffused layer of the first conduction type through implantation of ions into the base layer of the second conduction type.

In an aspect the present invention provides a method of manufacturing semiconductor devices, comprising: forming an anti-oxidizing layer on a surface of a semiconductor layer of a first conduction type, the anti-oxidizing layer having an aperture only through a region for use in formation of a guard ring layer of a second conduction type; forming the guard ring layer of the second conduction type in the surface of the semiconductor layer of the first conduction type through implantation of ions into a surface where said anti-oxidizing layer is formed; etching the anti-oxidizing layer along the film surface; forming an oxide layer at least in the aperture; forming a base layer of the second conduction type adjacent to the guard ring layer of the second conduction type in the surface of the semiconductor layer of the first conduction type; and forming a diffused layer of the first conduction type through implantation of ions into the base layer of the second conduction type.

DETAILED DESCRIPTION OF THE EMBODIMENTS

The embodiments of the present invention will now be described with reference to the drawings.

First Embodiment

A first embodiment is associated with a method of manufacturing a MOS-structured, trench gate semiconductor device. The present embodiment is described based on FIGS. 1-6.

Figure 1:
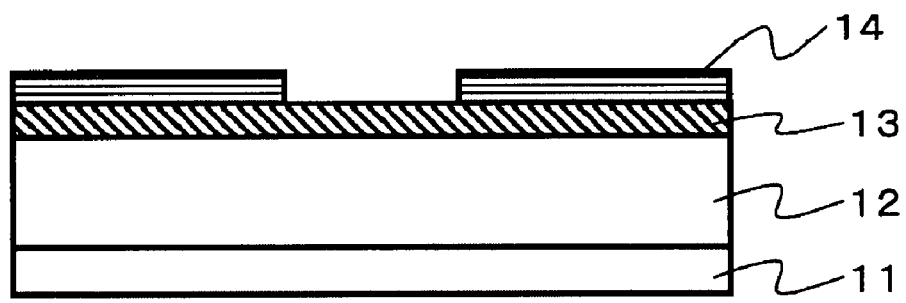
FIGS. 1-6 are process diagrams illustrative of a method of manufacturing semiconductor devices in a first embodiment.

First, as shown in FIG. 1, there is provided a semiconductor substrate or N-type single-crystal silicon substrate 11, on which an impurity- or P (phosphorous)-doped silicon is deposited by epitaxial growth to form an N-type epitaxial layer 12, on which an SiN (silicon nitride) layer 13 is formed. The SiN layer 13 is one example of an anti-oxidizing layer. The anti-oxidizing layer includes not only a single SiN layer but also a lamination layer of a nitride layer for a semiconductor process (for example, a silicon nitride layer) and an oxide layer for a semiconductor process (for example, a silicon oxide layer).

Thereafter, a photoresist is applied on the SiN layer 13, followed by pre-baking, exposing by the exposure device, and development to form a resist pattern 14 having an aperture only through a region for use in formation of a later-described guard ring layer.

Figure 2:
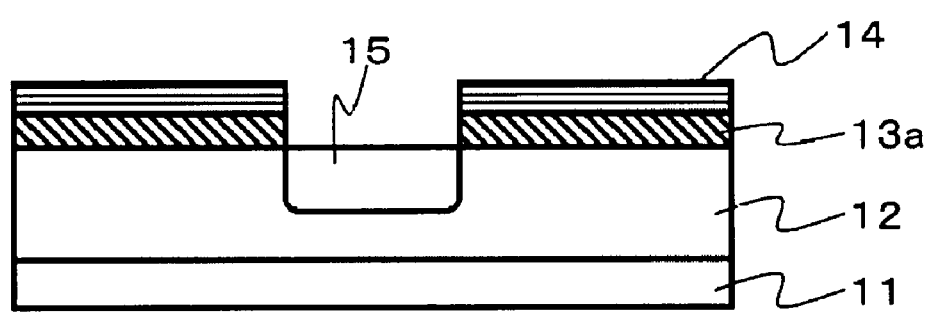

Next, as shown in FIG. 2, the SiN layer 13 is removed from the region that does not include the resist pattern 14 formed therein, thereby forming a pattern composed of the resist pattern 14 and the SiN layer 13a. Thereafter, with a mask of the resist pattern 14 and the SiN layer 13a, ions are implanted to form a guard ring layer 15. The material for use in this ion implantation is B (boron) or the like because the guard ring layer 15 is composed of a P-type semiconductor. Thus, B or the like is implanted into the region that does not include the resist pattern 14 and the SiN layer 13a formed therein.

Figure 3:
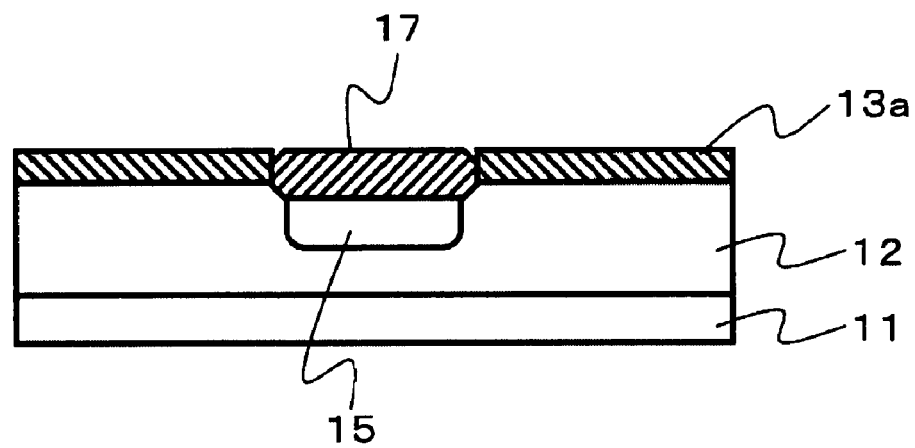

Then, as shown in FIG. 3, after removal of the resist pattern 14, thermal oxidation is applied to form an oxide layer 17. The oxide layer 17 can not be formed in the region that includes the SiN layer 13a formed therein because silicon in that region can not be oxidized thermally. The thermal oxidation proceeds only in the region (the aperture) that does not include the SiN layer 13a formed therein, thereby forming the oxide layer 17. As the oxide layer 17 is formed through thermal oxidation of silicon, the volume is slightly expanded by the oxidation and the shape is extended beyond the contour of the guard ring layer 15 as shown in FIG. 3.

Figure 4:
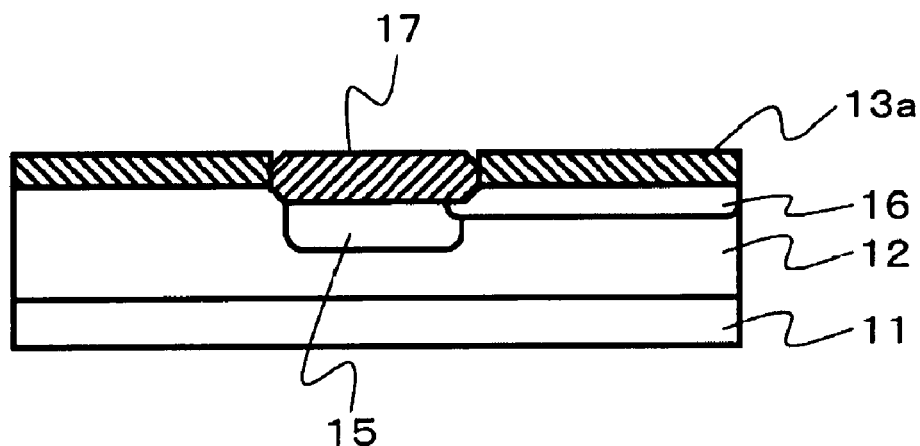

Next, a P-type base layer 16 is formed as shown in FIG. 4. Specifically, after removal of the resist pattern 14, another resist pattern, not shown, for use in formation of the P-type base layer 16 is formed. Then, ions of B or the like are implanted to form the P-type base layer 16. Thereafter, the resist pattern, not shown, is removed. The method of forming the resist pattern comprises photoresist application, pre-baking, exposure, and development, similar to the foregoing.

Figure 5:
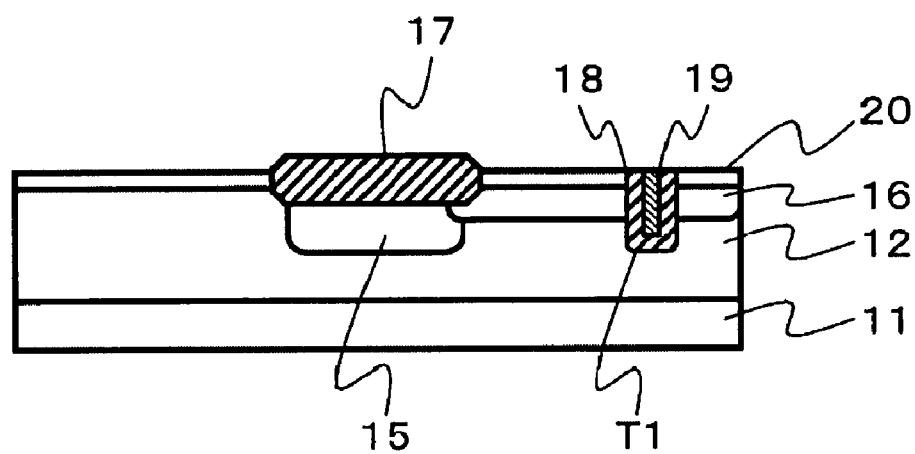

Next, a trench oxide 18 is formed, then a trench gate 19, followed by formation of an N-type source layer 20 as shown in FIG. 5. Specifically, for formation of the trench gate 19 on the SiN layer 13a, a resist pattern, not shown, having an aperture only in the region for use in formation of the trench gate 19 is formed. Thereafter, the SiN layer 13a is removed from the region that does not include the resist pattern (not shown) formed therein, that is, the region for use in formation of the trench gate 19. Thereafter, an etching such as RIE (Reactive Ion Etching) is applied to form a trench T1. Then, after removal of the resist pattern, not shown, thermal oxidation is applied to oxidize silicon in the surface of the trench T1 to form the trench oxide 18. Subsequently, polysilicon is buried into the trench T1 with the trench oxide 18 formed therein, thereby forming the trench gate 19.

Thereafter, the SiN layer 13a is removed from the entire surface, and then ions of As (arsenic) or the like are implanted into the entire surface of the exposed epitaxial layer 12 to form the N-type source layer 20. The N-type source layer 20 can be formed only in the region that does not include the insulator film 17 formed therein. Namely, as the insulator film 17 is sufficiently thick, ions of As or the like can not be implanted into the region that includes the oxide layer 17 formed therein and accordingly the N-type source layer 20 can not be formed in that region. Therefore, the N-type source layer 20 can be formed only in the region that does not include the oxide layer 17 formed therein.

Figure 6:
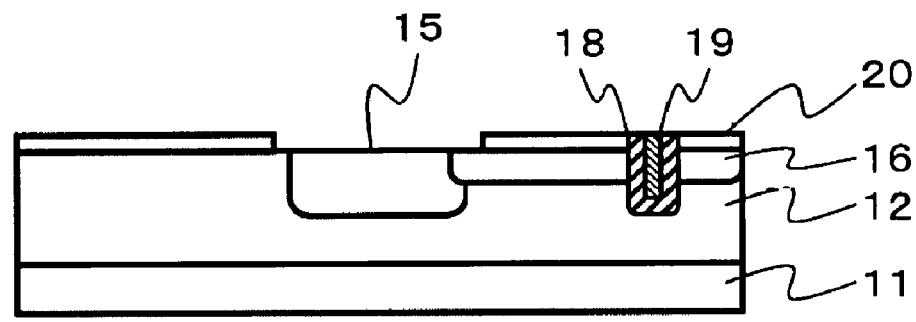

Subsequently, after removal of the oxide layer 17 as shown in FIG. 6, a source electrode, not shown, is formed in connection with the N-type source layer 20 and the P-type base layer 16. In addition, a drain electrode, not shown, is formed in connection with the N-type silicon substrate 11, thereby completing the MOS-structured, trench gate semiconductor device in the present embodiment.

In the present embodiment, the oxide layer 17 is used in the step of forming the N-type source layer 20. In a general method, a resist pattern is used in the step of forming the N-type source layer 20. In contrast, the present embodiment does not require the step of photolithography for forming the resist pattern and can reduce the process.

Figure 7:
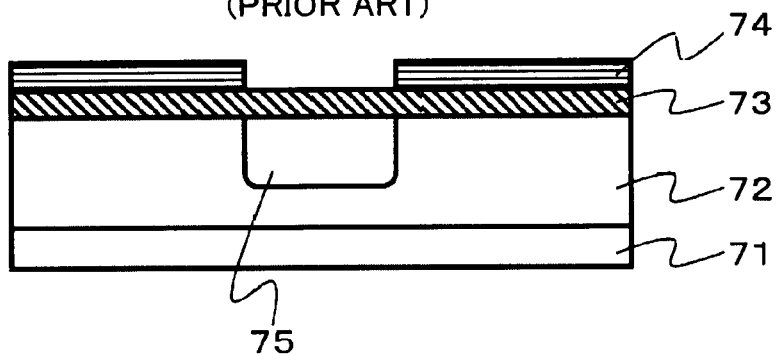
FIGS. 7-10 are process diagrams illustrative of a method of manufacturing general MOS-structured semiconductor devices.

Specifically describing based on FIGS. 7-10, a general method comprises first providing an N-type silicon substrate 71, on which an N-type epitaxial layer 72 is formed as shown in FIG. 7. A silicon oxide layer 73 is then formed thereon, followed by forming a resist pattern 74 having an aperture only in the region that includes a guard ring layer 75 to be formed therein. Then, ions of B or the like are implanted to form the guard ring layer 75.

Figure 8:
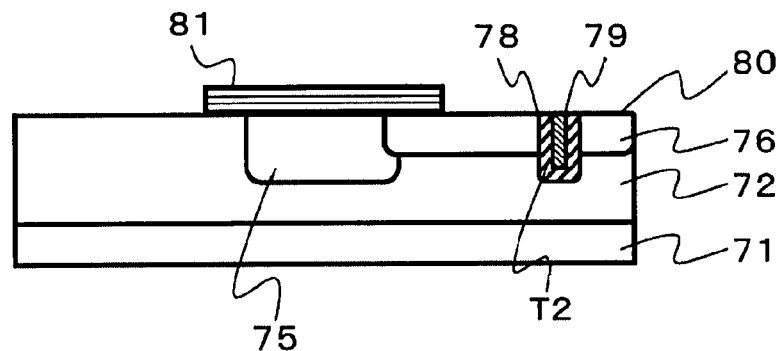

Thereafter, after removal of the resist pattern 74 as shown in FIG. 8, a P-type base layer 76 is formed in the surface of the N-type epitaxial layer 72. A trench T2 is then formed, followed by forming a trench insulator 78 on the inner surface of the trench T2, and burying polysilicon therein to form a trench gate 79. Then, after removal of the silicon oxide layer 73, a resist pattern 81 is formed. This resist pattern 81 includes the resist formed only in the region that does not include a later-described N-type source layer 80 to be formed.

Figure 9:
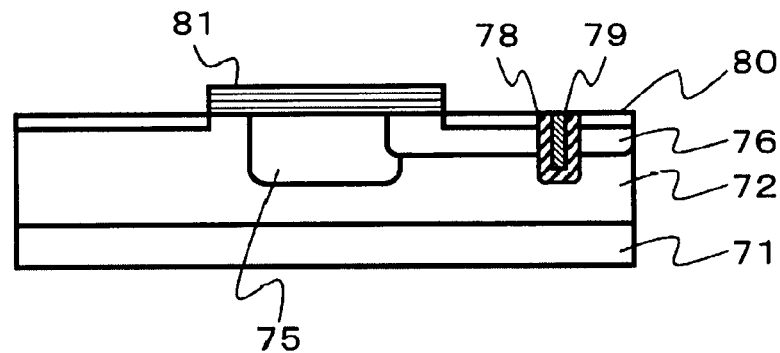

Subsequently, ions of As or the like are implanted to form the N-type source layer 80 only in the region that does not include the resist pattern 81 formed therein as shown in FIG. 9.

Figure 10:
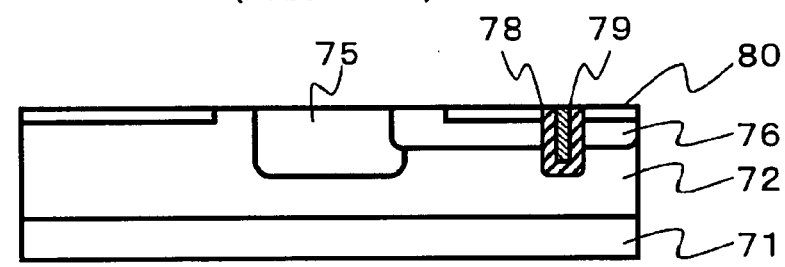

Thereafter, the resist pattern 81 is removed to complete the device as shown in FIG. 10.

As described above, the general method requires the step of photolithography with the resist pattern 81 to form the N-type source layer 80. In contrast, the present embodiment does not require the step of photolithography for that purpose. Therefore, it can reduce the number of process steps and can reduce the production cost.

Second Embodiment

A second embodiment is associated with a method of manufacturing a MOS-structured, trench gate semiconductor device. The present embodiment is described based on FIGS. 11-17.

Figure 11:
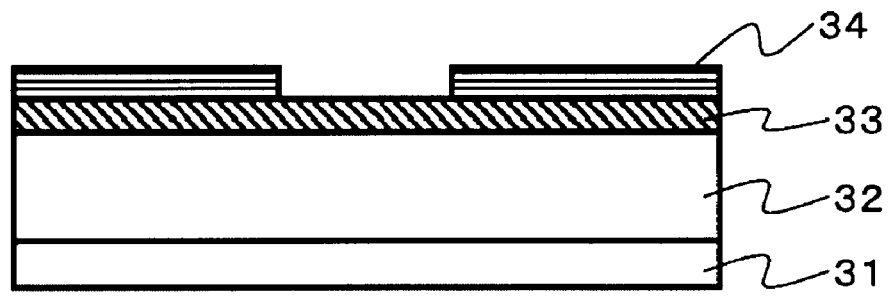
FIGS. 11-17 are process diagrams illustrative of a method of manufacturing MOS-structured semiconductor devices in a second embodiment.

First, as shown in FIG. 11, there is provided a semiconductor substrate or N-type single-crystal silicon substrate 31, on which an impurity- or P (phosphorous)-doped silicon is deposited by epitaxial growth to form an N-type epitaxial layer 32, on which a SiN (silicon nitride) layer 33 is formed. Thereafter, a photoresist is applied on the SiN layer 33, followed by pre-baking, exposing by the exposure device, and development to form a resist pattern 34 having an aperture only through a region for use in formation of a later-described guard ring layer.

Figure 12:
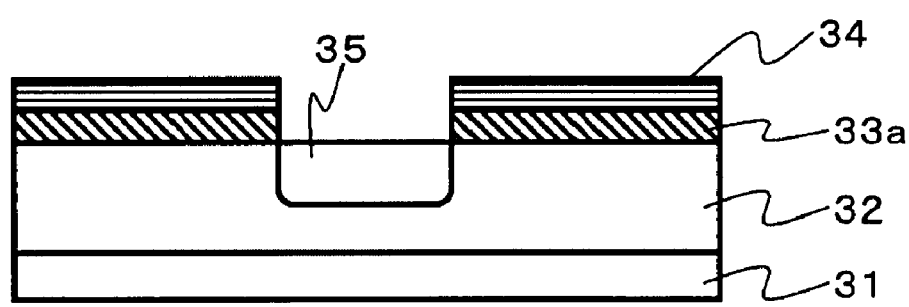

Next, as shown in FIG. 12, the SiN layer 33 is removed from the region that does not include the resist pattern 34 formed therein, thereby forming a pattern composed of the resist pattern 34 and the SiN layer 33a. Thereafter, with a mask of the resist pattern 34 and the SiN layer 33a, ions are implanted to form a guard ring layer 35. The material for use in this ion implantation is B (boron) or the like because the guard ring layer 35 is composed of a P-type semiconductor. Thus, B or the like is implanted into the region that does not include the resist pattern 34 and the SiN layer 33a formed therein.

Figure 13:
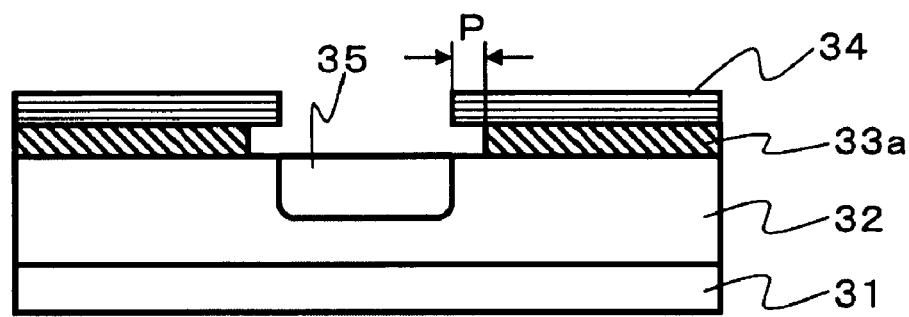
Figure 18:
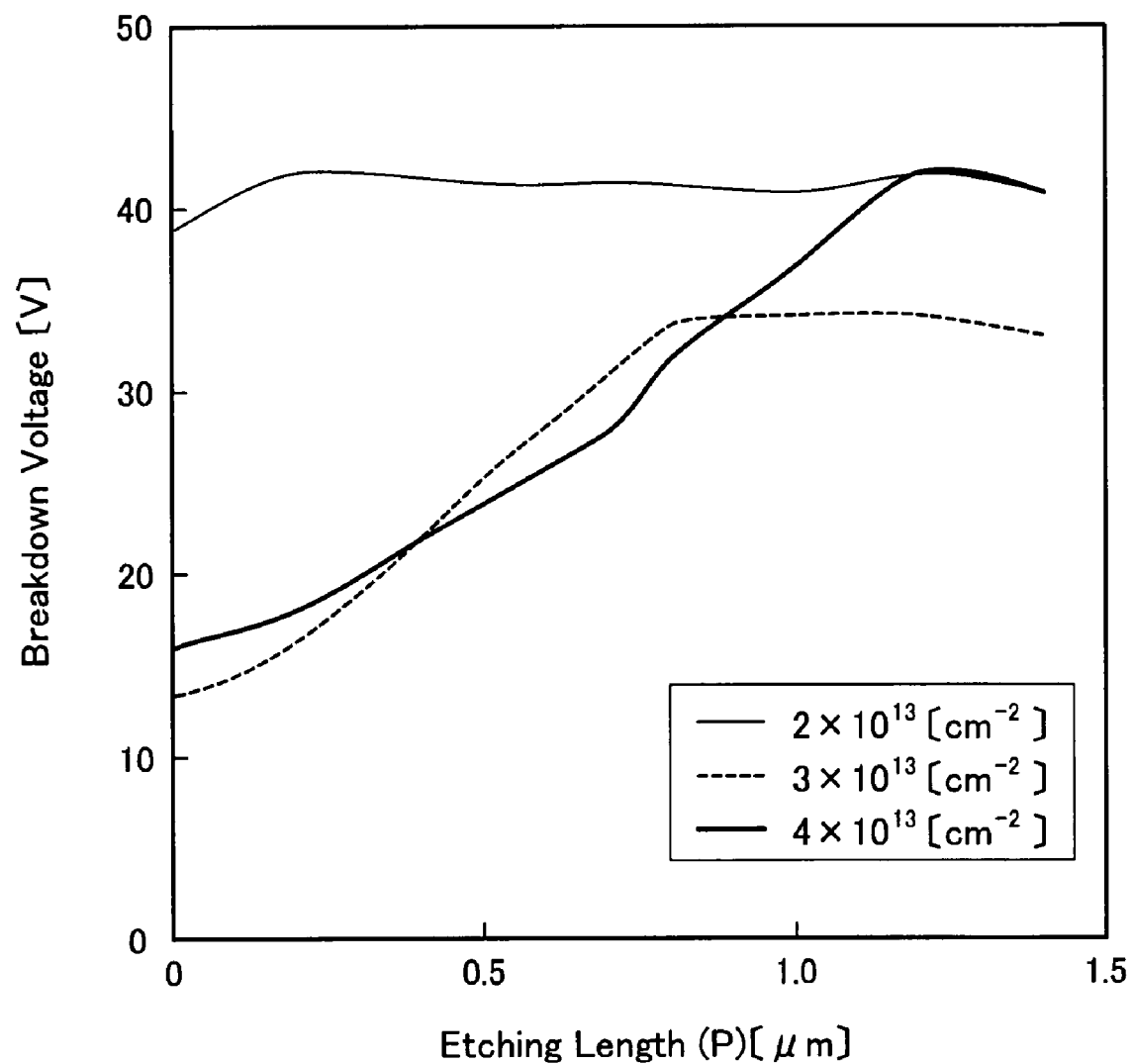
FIG. 18 is a graph showing correlations between the etching length (P) and the breakdown voltage in the second embodiment.

Next, as shown in FIG. 13, an etching is applied to the SiN layer 36 to expand the aperture. Specifically, an etching such as wet etching capable of etching only SiN is applied. As shown in FIG. 18, the etching length P has a correlation with the breakdown voltage of the semiconductor device to be formed (such as a MOS transistor) and also depends on the impurity dose in the guard ring layer 35. Therefore, in consideration of the breakdown voltage of the semiconductor device to be formed, the impurity dose and the etching length P are determined in the guard ring layer 35. As obvious from FIG. 4, an etching length P of 1.2 [μm] or more achieves a breakdown voltage of 40 [V] or higher even at a dose of $4 \times 10^{13}$ [cm$^{-2}$] in the guard ring layer 35.

Figure 14:
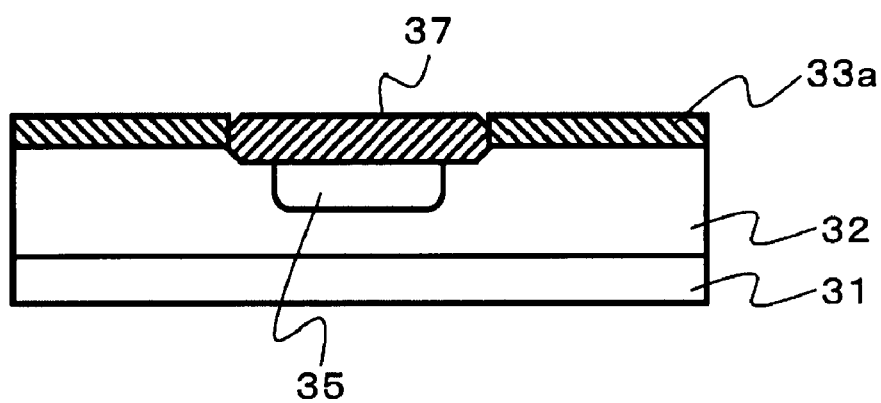

Then, as shown in FIG. 14, after removal of the resist pattern 34, thermal oxidation is applied to form an oxide layer 37. The oxide layer 37 can not be formed in the region that includes the SiN layer 33a formed therein because silicon in that region can not be oxidized thermally. The thermal oxidation proceeds only in the region (the aperture) that does not include the SiN layer 33a formed therein, thereby forming the oxide layer 37. As the oxide layer 37 is formed through thermal oxidation of silicon, the volume is slightly expanded by the oxidation and the shape is extended as shown.

Figure 15:
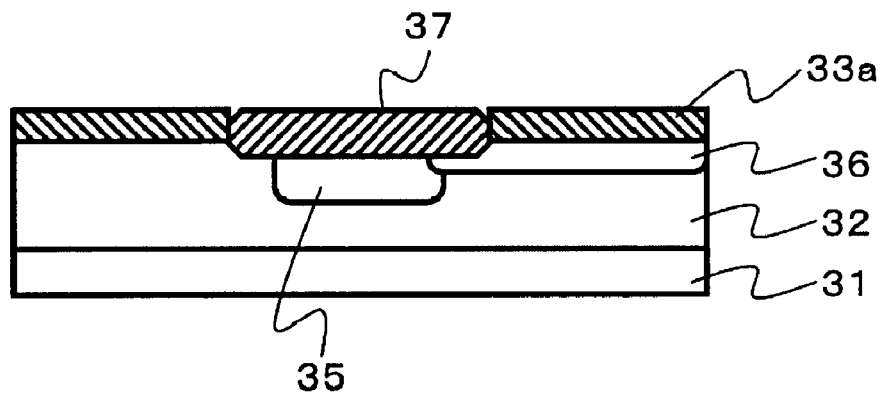

Next, a P-type base layer 36 is formed as shown in FIG. 15. Specifically, after removal of the resist pattern 34, another resist pattern, not shown, for use in formation of the P-type base layer 36 is formed. Then, ions of B or the like are implanted to form the P-type base layer 36. Thereafter, the resist pattern, not shown, is removed. The method of forming the resist pattern comprises photoresist application, pre-baking, exposure, and development, similar to the foregoing.

Figure 16:
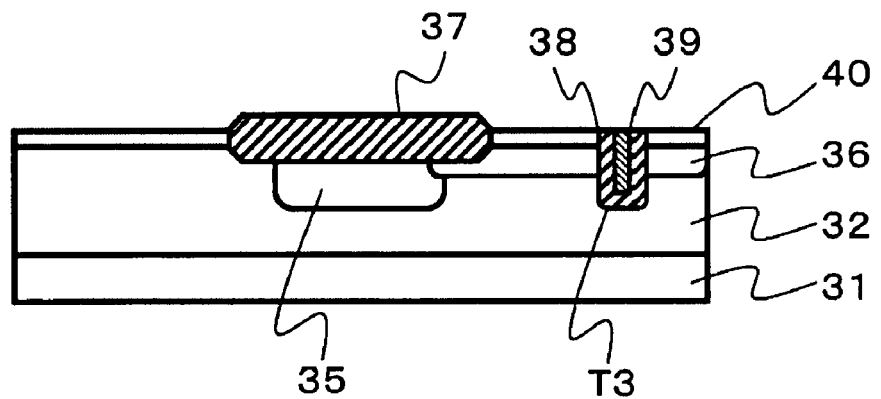

Next, a trench oxide 38 is formed, then a trench gate 39, followed by formation of an N-type source layer 40 as shown in FIG. 16. Specifically, for formation of the trench gate 39 on the SiN layer 33a, a resist pattern, not shown, having an aperture only in the region for use in formation of the trench gate 39 is formed. Thereafter, the SiN layer 33a is removed from the region that does not include the resist pattern, not shown, formed therein, that is, the region for use in formation of the trench gate 39. Thereafter, an etching such as RIE (Reactive Ion Etching) is applied to form a trench. Then, after removal of the resist pattern, not shown, thermal oxidation is applied to oxidize silicon in the surface of the trench to form the trench oxide 38. Subsequently, polysilicon is buried into the trench with the trench oxide 38 formed therein, thereby forming the trench gate 39. Thereafter, the SiN layer 33a is removed from the entire surface, and then ions of As (arsenic) or the like are implanted to form the N-type source layer 40. The N-type source layer 40 can be formed only in the region that does not include the insulator film 37 formed therein. Namely, as the insulator film 37 is sufficiently thick, ions of As or the like can not be implanted into the region that includes the oxide layer 37 formed therein and accordingly the N-type source layer 40 can not be formed in that region. Therefore, the N-type source layer 40 can be formed only in the region that does not include the oxide layer 37 formed therein.

Figure 17:
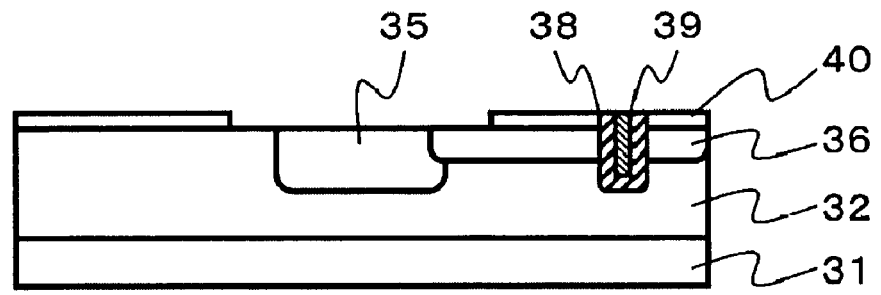

Subsequently, after removal of the oxide layer 37 as shown in FIG. 17, a source electrode and a drain electrode, not shown, are formed, thereby completing the MOS-structured, trench gate semiconductor device in the present embodiment.

In the present embodiment, the oxide layer 37 is used in the step of forming the N-type source layer 40. In a general method, a resist pattern is used in the step of forming the N-type source layer 40. In contrast, the present embodiment does not require the step of photolithography for forming the resist pattern and can reduce the process.

In the process of etching the SiN film 36, an adjustment of the etching length P makes it possible to sufficiently ensure the breakdown voltage of the semiconductor device to be formed.

The methods of manufacturing semiconductor devices of the present invention have been described in detail in the above embodiments though the present invention is not limited to the above embodiments but rather can take other forms.

What is claimed is:

1. A method of manufacturing semiconductor devices, comprising:
   forming an anti-oxidizing layer on a surface of a semiconductor layer of a first conduction type, said anti-oxidizing layer having an aperture only through a region for use in formation of a guard ring layer of a second conduction type;
   forming said guard ring layer of the second conduction type in the surface of said semiconductor layer of the first conduction type by implanting ions through said aperture of said anti-oxidizing layer into a surface of said semiconductor layer;
   forming an oxide layer at least in said aperture;
   forming a base layer of the second conduction type adjacent to said guard ring layer of the second conduction type in the surface of said semiconductor layer of the first conduction type; and
   forming a diffused layer of the first conduction type through implantation of ions into said base layer of the second conduction type,
   wherein said oxide layer is formed in said aperture and not formed on said anti-oxidizing layer, and said base layer of the second conduction type is formed adjacent to said guard ring layer of the second conduction type by ion implantation with the oxide layer as a mask.

2. The method of manufacturing semiconductor devices according to claim 1, wherein said oxide layer is formed extendedly beyond the contour of said guard ring layer.

3. The method of manufacturing semiconductor devices according to claim 1, wherein said oxide layer is formed through thermal oxidation.

4. The method of manufacturing semiconductor devices according to claim 3, wherein said oxide layer is formed in said aperture and not formed on said anti-oxidizing layer, and said base layer of the second conduction type is formed adjacent to said guard ring layer of the second conduction type by ion implantation with the oxide layer as a mask.

5. The method of manufacturing semiconductor devices according to claim 1, further comprising:
   forming a trench after formation of said base layer of the second conduction type, said trench extending from the surface of said base layer of the second conduction type to said semiconductor layer of the first conduction type; and
   forming a trench insulating layer on the inner surface of said trench; and
   burying polysilicon into said trench where said trench insulating layer is formed to form a trench gate.

6. The method of manufacturing semiconductor devices according to claim 1, wherein the step of forming a diffused layer of the first conduction type includes implanting ions into said semiconductor layer after removal of said anti-oxidizing layer to form a diffused layer of the first conduction type.

7. The method of manufacturing semiconductor devices according to claim 1, further comprising removing said oxide layer.

8. A method of manufacturing semiconductor devices, comprising:
   forming an anti-oxidizing layer on a surface of a semiconductor layer of a first conduction type, said anti-oxidizing layer having an aperture only through a region for use in formation of a guard ring layer of a second conduction type;
   forming said guard ring layer of the second conduction type in the surface of said semiconductor layer of the first conduction type by implanting ions through said aperture of said anti-oxidizing layer into a surface of said semiconductor layer;
   etching said anti-oxidizing layer along a surface of said semiconductor layer;
   forming an oxide layer at least in said aperture;
   forming a base layer of the second conduction type adjacent to said guard ring layer of the second conduction type in the surface of said semiconductor layer of the first conduction type; and
   forming a diffused layer of the first conduction type through implantation of ions into said base layer of the second conduction type.

9. The method of manufacturing semiconductor devices according to claim 8, wherein said anti-oxidizing layer has an etching length determined from a breakdown voltage of said semiconductor device to be formed and a dose of ions implanted on formation of said guard ring layer of the second conduction type.

10. The method of manufacturing semiconductor devices according to claim 8, wherein said oxide layer is formed through thermal oxidation.

11. The method of manufacturing semiconductor devices according to claim 8, further comprising:
    forming a trench after formation of said base layer of the second conduction type, said trench extending from the surface of said base layer of the second conduction type to said semiconductor layer of the first conduction type; and
    forming a trench insulating layer on the inner surface of said trench; and
    burying conductor material into said trench where said trench insulating layer is formed, to form a trench gate.

12. The method of manufacturing semiconductor devices according to claim 8, wherein said oxide layer is formed in said aperture and not formed on said anti-oxidizing layer, and said base layer of the second conduction type is formed adjacent to said guard ring layer of the second conduction type by ion implantation with the oxide layer as a mask.

13. The method of manufacturing semiconductor devices according to claim 8, wherein said oxide layer is formed extendedly beyond the contour of said guard ring layer.

14. The method of manufacturing semiconductor devices according to claim 13, wherein said oxide layer is formed through thermal oxidation.

15. The method of manufacturing semiconductor devices according to claim 14, wherein said oxide layer is formed in said aperture and not formed on said anti-oxidizing layer, and said base layer of the second conduction type is formed adjacent to said guard ring layer of the second conduction type by ion implantation with the oxide layer as a mask.

16. The method of manufacturing semiconductor devices according to claim 8, wherein the step of forming a diffused layer of the first conduction type includes implanting ions into said semiconductor layer after removal of said anti-oxidizing layer to form a diffused layer of the first conduction type.

17. The method of manufacturing semiconductor devices according to claim 8, further comprising removing said oxide layer.

18. The method of manufacturing semiconductor devices according to claim 1, wherein said base layer of the second conduction type is formed adjacent to said guard ring layer of the second conduction type by ion implantation with the oxide layer as a mask.

* * * * *